(12) United States Patent  
Kishita et al.

(10) Patent No.: US 8,722,152 B2  
(45) Date of Patent: May 13, 2014

(54) WET PROCESSING APPARATUS, WET PROCESSING METHOD AND STORAGE MEDIUM

(71) Applicant: Tokyo Electron Limited, Tokyo (JP)

(72) Inventors: Naofumi Kishita, Koshi (JP); Kouji Fujimura, Koshi (JP); Yoshitaka Hara, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 13/914,742

(22) Filed: Jun. 11, 2013

(65) Prior Publication Data

US 2013/0273256 A1    Oct. 17, 2013

Related U.S. Application Data

(62) Division of application No. 13/037,624, filed on Mar. 1, 2011, now Pat. No. 8,522,714.

(30) Foreign Application Priority Data

Mar. 4, 2010   (JP) .................................. 2010-048111

(51) Int. Cl.  
*B05D 1/02* (2006.01)

(52) U.S. Cl.  
USPC .......... 427/427.1; 118/52; 118/314; 118/321; 118/663; 118/680; 427/8; 427/427.2; 427/427.3

(58) Field of Classification Search  
USPC ........... 118/313–315, 52, 612, 319–321, 323, 118/663, 686, 687, 679–681; 427/240, 427/427.1, 424, 425, 427.2, 427.3  
See application file for complete search history.

(56) References Cited

U.S. PATENT DOCUMENTS 5,960,225 A * 9/1999 Fujimoto ...................... 396/611  
2010/0040779 A1   2/2010 Nagamine et al.

FOREIGN PATENT DOCUMENTS

JP    2010-045185 A1   2/2010

* cited by examiner

*Primary Examiner* — Alexander Weddle  
(74) *Attorney, Agent, or Firm* — Burr & Brown, PLLC

(57) ABSTRACT

A wet processing apparatus for wet-processing substrates can suppress the reduction of throughput when some component part thereof becomes unserviceable. The wet processing apparatus includes a first nozzle unit and a second nozzle unit. When the wet processing apparatus operates in a normal mode, a substrate carrying mechanism is controlled so as to deliver substrates alternately to processing units of a first group and those of a second group so that the substrates are processed sequentially in order. When the processing units of the first group (the second group) are unserviceable due to the inoperativeness of the substrate holders, a processing liquid supply system or a nozzle support mechanism, the nozzle unit for the processing units of the second group (the first group) is moved to process substrates by the serviceable ones of the first group (the second group).

4 Claims, 14 Drawing Sheets

WET PROCESSING APPARATUS, WET PROCESSING METHOD AND STORAGE MEDIUM

CROSS-REFERENCE TO RELATED APPLICATIONS

This application is a division of U.S. application Ser. No. 13/037,624 filed Mar. 1, 2011, now U.S. Pat. No. 8,522,714, the entirety of which is incorporated herein by reference.

FIELD OF THE INVENTION

The present disclosure relates to a wet processing apparatus which processes substrates by a wet process that uses a processing liquid, a wet processing method, and a storage medium.

BACKGROUND OF THE INVENTION

A photoresist pattern forming process, which is one of semiconductor device fabricating processes, coats a surface of a semiconductor wafer (hereinafter referred to as "wafer"), namely, a substrate, with a resist film, exposes the resist film in a desired pattern, and then develops the exposed resist film to form a photoresist pattern. Usually, the photoresist forming process is carried out by a photoresist pattern forming system built by combining a coating and developing system, which coats a wafer with a resist film and develops the resist film after exposure, and an exposure system.

The coating and developing system is provided with various kinds of wet processing apparatuses. The wet processing apparatus is, for example, a resist solution application apparatus which coats a wafer with a resist solution. The resist solution application apparatus is provided with resist solution application units. Each resist solution application unit is provided with a wafer holder, a splash cup surrounding a wafer held by the wafer holder to stop the splashed resist solution, and such.

The resist solution application apparatus is provided with a nozzle head for pouring a resist solution onto a wafer W. The nozzle head is supported on a support arm to form a nozzle unit. A nozzle unit mentioned in JP-A 2010-045185 is used by a plurality of resist solution application units, for example, three resist solution application units, in common. The nozzle unit moves from one to another of the resist solution application units to pour a resist solution onto a wafer W held by the wafer holder. Developing devices which process a wafer w by a developing process are the same in construction as the resist solution application units, except that the resist solution application units and the developing devices use different processing solutions, respectively, for processing wafers W.

The respective numbers of the resist solution application units and the nozzle units are different. Therefore, plurality of resist solution application units cannot process wafers if processing solution supply lines for carrying a processing solution to the nozzle unit are stopped for maintenance or if the nozzle unit cannot operate due to trouble. When a resist solution pouring time for which the resist solution is poured onto a wafer in a normal processing process is long, the nozzle unit needs to be kept for a long time at one resist solution application unit, and hence the start of other resist solution application units is delayed. Consequently, the throughput of the wet processing apparatus is low. Accordingly, there has been a demand for a resist solution application apparatus capable of executing a normal wafer processing process at a high throughput and of suppressing the reduction of throughput when components thereof malfunction or needs maintenance.

SUMMARY OF THE INVENTION

Accordingly, it is an object of the present disclosure to provide a wet processing apparatus for processing substrates by a wet process, capable of suppressing the reduction of throughput when a component part thereof becomes unserviceable, a wet processing method, and a storage medium.

A wet processing apparatus according to the present disclosure for processing substrates by pouring a processing solution supplied by a processing solution supply system onto the substrates, includes: 2n (n is an integer not smaller than 2) processing units arranged in a lateral row, including 2n substrate holders for supporting a substrate in a horizontal position and 2n splash cups respectively surrounding the substrate holders, and divided into a first group of the n processing units on the left side and a second group of the n processing units on the right side; a first nozzle unit to be used exclusively for the n processing units of the first group in a normal processing mode; a first nozzle support mechanism supporting the first nozzle unit and capable of laterally moving the first nozzle unit to all the 2n processing units; a second nozzle unit to be used exclusively for the n processing units of the second group in a normal processing mode; a second nozzle support mechanism supporting the second nozzle and capable of laterally moving the second nozzle unit to all the 2n processing units; a substrate carrying mechanism for transferring a substrate to and receiving a substrate from the substrate holders; and a controller which provides control signals for controlling the substrate carrying mechanism to deliver substrates alternately to the processing unit of the first group and that of the second group so as to use the processing units of the first and the second group in order in a normal processing mode, and for moving the first nozzle unit for the processing units of the first group to use the first nozzle unit for processing substrates by the serviceable ones of the processing units of the second group when the processing unit of the second group becomes unable to process substrates due to the inoperativeness of the substrate holder, the processing solution supply system or the nozzle support mechanism or for moving the second nozzle unit for the processing units of the second group to use the second nozzle unit for processing substrates by the serviceable ones of the processing units of the first group when the processing unit of the first group becomes unable to process substrates due to the inoperativeness of the substrate holder, the processing solution supply system or the nozzle support mechanism.

The controller may provide a control signal to move the first nozzle unit to use the first nozzle unit for processing substrates by the processing units of the second group specified by the operator or to move the second nozzle unit to use the second nozzle unit for processing substrates by the processing units of the first group specified by the operator when the processing unit of the first group is unable to process substrates. The controller may provide a control signal to move the first nozzle unit to use the first nozzle unit for processing substrates by the processing units of the second group previously specified according to the state when the processing unit of the second group is unable to process substrates or to move the second nozzle unit to use the second nozzle unit for processing substrates by the processing units of the first group previously specified according to the state when the processing unit of the first group is unable to process substrates.

The controller may choose a manual mode or an automatic mode when either the processing unit of the first group or that of the second group becomes unable to process substrates.

For example, the controller provides a control signal to move the first nozzle unit to use the first nozzle unit for processing substrates by the processing units of the second group specified by the operator or to move the second nozzle unit to use the second nozzle unit for processing substrates by the processing units of the first group specified by the operator when the manual mode is chosen, and the controller provides a control signal to move the first nozzle unit to use the first nozzle unit for processing substrates by the processing units of the second group previously specified according to the state or to move the second nozzle unit to use the second nozzle unit for processing substrates by the processing units of the first group previously specified according to the state when the automatic mode is chosen.

A wet processing method according to the present disclosure to be carried out by a wet processing apparatus for processing substrates by pouring a processing liquid supplied by a processing liquid supply system onto the substrates, including 2n (n is an integer not smaller than 2) processing units arranged in a lateral row, including 2n substrate holders for supporting a substrate in a horizontal position and 2n splash cups respectively surrounding the substrate holders, and divided into a first group of the n processing units on the left side and a second group of the n processing units on the right side, a first nozzle unit to be used exclusively for the n processing units of the first group in a normal processing mode, a first nozzle support mechanism supporting the first nozzle unit and capable of moving the first nozzle unit to all the 2n processing units, a second nozzle unit to be used exclusively for processing substrates by the n processing units of the second group in a normal processing mode, a second nozzle support mechanism supporting the second nozzle unit and capable of moving the second nozzle unit to all the 2n processing units, a substrate carrying mechanism for transferring a substrate to and receiving a substrate from the substrate holders; includes the steps of: pouring the processing liquid through the first nozzle unit onto substrates supported on the substrate holders of the processing units of the first group in a normal processing mode; pouring the processing liquid through the second nozzle unit onto substrates supported on the substrate holders of the processing units of the second group in the normal processing mode; transferring substrates alternately to the processing unit of the first group and that of the second group so as to use the processing units of the first and the second group in order; and laterally moving the first nozzle unit for the processing units of the first group to use the first nozzle unit for processing substrates by the serviceable ones of the processing units of the second group when the substrate holder, the processing liquid supply system or the nozzle support mechanism is unserviceable or laterally moving the second nozzle unit for the processing units of the second group to use the second nozzle unit for processing substrates by the serviceable ones of the processing units of the first group when the substrate holder, the processing liquid supply system or the nozzle support mechanism is unserviceable.

The substrate processing method may further include the step of moving the first nozzle unit to use the first nozzle unit for processing substrates by the processing units of the second group specified by the operator when the processing unit of the second group is unable to process substrates or moving the second nozzle unit to use the second nozzle unit for processing substrates by the processing units of the first group specified by the operator when the processing unit of the first group is unable to process substrates. The wet processing method may further include the step of moving the first nozzle unit to use the first nozzle unit for processing substrates by the processing units of the second group previously specified according to the state when the processing unit of the second group is unable to process substrates or moving the second nozzle unit to use the second nozzle unit for processing substrates by the processing units of the first group previously specified according to the state when the processing unit of the first group is unable to process substrates.

A storage medium according to the present disclosure stores computer programs including sets of instructions to be executed by a substrate processing apparatus for processing substrates by a wet process in the steps of the foregoing wet processing method.

According to the present disclosure, the first nozzle unit for the processing units of the first group is used for processing substrates by the serviceable ones of the processing units of the second group when the processing unit of the second group becomes unable to process substrates or the second nozzle unit for the processing units of the second group is used for processing substrates by the serviceable ones of the processing units of the first group when the processing unit of the first group becomes unable to process substrates. Thus, the reduction of the throughput of the wet processing apparatus can be suppressed when the wet processing apparatus needs maintenance or some component part of the wet processing apparatus malfunctions.

DETAILED DESCRIPTION OF THE INVENTION

Figure 1:
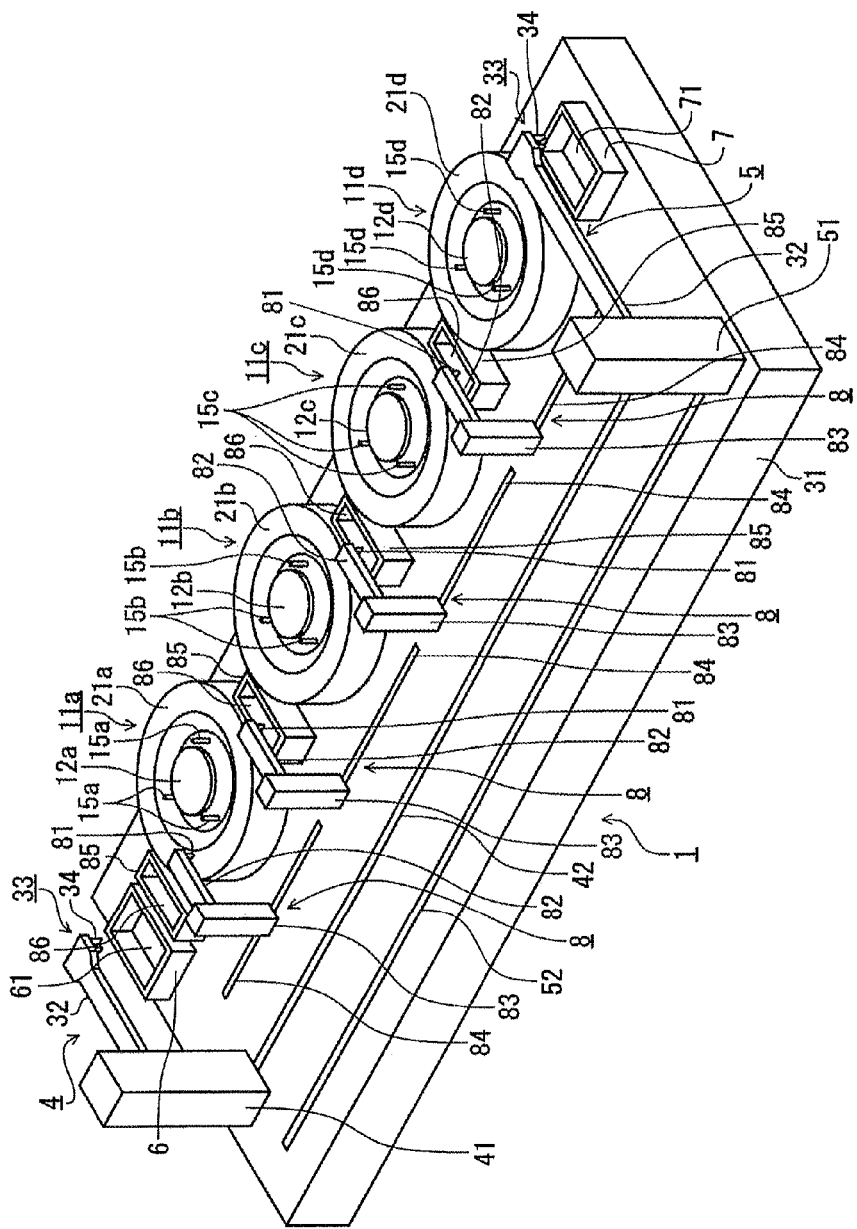
FIG. 1 is a perspective view of a resist solution application apparatus in a preferred embodiment according to the present disclosure.

A resist solution application apparatus 1, namely, a wet processing apparatus, in a preferred embodiment according to the present disclosure will be described with reference to a perspective view and a plan view of the resist solution application apparatus 1 shown in FIGS. 1 and 2, respectively. The resist solution application apparatus 1 has a base 31, and four resist solution application units 11a, 11b, 11c and 11d arranged in a lateral row on the base 31.

The resist solution application units 11a to 11d are the same in construction, and hence the resist solution application unit 11a will be described by way of example with reference to a longitudinal sectional view shown in FIG. 3. The resist solution application unit 11a has a spin chuck 12a provided with a shaft 13a, namely, a substrate holder for holding a wafer W thereon by attracting a central part of the wafer W by suction, and a rotational driving mechanism 14a interlocked with the shaft 13a. The rotational driving mechanism 14a drives the spin chuck 12a holding a wafer W for rotation about a vertical axis. The rotational driving mechanism 14a is controlled by control signals provided by a controller 90 to rotate the spin chuck 12a at a desired rotating speed. The rotational driving mechanism 14a gives the controller 90 a signal indicating the rotating speed of the spin chuck 12a.

A splash cup 21a having an open upper end surrounds the spin chuck 12a and a wafer W held by the spin chuck 12a. A sump 23a having the shape of a U-shaped annular groove forms the bottom of the splash cup 21a. The interior of the sump 23a is divided into an outer annular space and an inner annular space by a partition wall 24a. The outer and the inner annular space extend outside a circle under the circumference of a wafer W held by the spin chuck 12a. A drain port 25a is formed in a part of the bottom wall of the sump 23a corresponding to the outer annular space, Exhaust ports 26a for exhausting a processing atmosphere is formed in parts of the bottom wall of the sump 23a corresponding to the inner annular space. Three lifting pins 15a capable of being vertically moved are arranged in the splash cup 21a. Only the two lifting pins 15a are shown in FIG. 3 for convenience. A lifting mechanism 16a moves the lifting pins 15a vertically according to the operation of a substrate carrying mechanism 10 for carrying a wafer W to the resist solution application apparatus 1. A wafer W is transferred between the substrate carrying mechanism 10 and the spin chuck 12a by vertically moving the lifting pins 15a.

In the drawings, parts of the resist solution application units 11b, 11c and 11d corresponding to those of the resist solution application unit 11a are designated by the same numerals with suffixes b, c and d.

Two nozzle units 4 and 5 are installed on the base 31. The nozzle units 4 and 5 are the same in construction, and hence the nozzle unit 4 will be described by way of example. The nozzle unit 4 includes a nozzle support mechanism 41, a composite nozzle head 33, and an arm 32 supporting the composite nozzle head 32. The nozzle support mechanism 41 moves along a guide 42 extended parallel to the row of the resist solution application units 11a to 11d on the base 31. The lateral movement of the nozzle support mechanism 41 along the guide 42 is controlled by control signals provided by the controller 90. The nozzle support mechanism 41 sends a position signal indicating a position thereof with respect to the lateral direction to the controller 90.

The arm 32 extends in a horizontal plane from the nozzle support mechanism 41 in a direction perpendicular to the moving direction of the nozzle support mechanism 41. The composite nozzle head 33 has, for example, nine resist solution pouring nozzles 34 and one thinner spouting nozzle 35. Thinner is a wettability improving liquid for improving the wettability of the surface of a wafer W. The resist solution pouring nozzles 34 and the thinner spouting nozzle 35 are arranged in a row parallel to the lateral row of the resist solution application units 11a to 11d on a free end part of the arm 32. The resist solution pouring nozzles 34 and the thinner spouting nozzle 35 move above a lateral line passing the centers of wafers W held on the spin chucks 12a to 12d of the resist solution application units 11a to 11d.

The nozzle unit 5 has a nozzle support mechanism 51 corresponding to the nozzle support mechanism 41. The nozzle support mechanism 51 moves along a guide 52 laid parallel to the lateral row of the resist solution application units 11a to 11d on the base 31. Thus, the nozzles of the nozzle unit 5, similarly to those of the nozzle unit 4, can pour the resist solution and the thinner onto wafers W held by the spin chucks 12a to 12d of the resist solution application units 11a to 11d.

Figure 3:
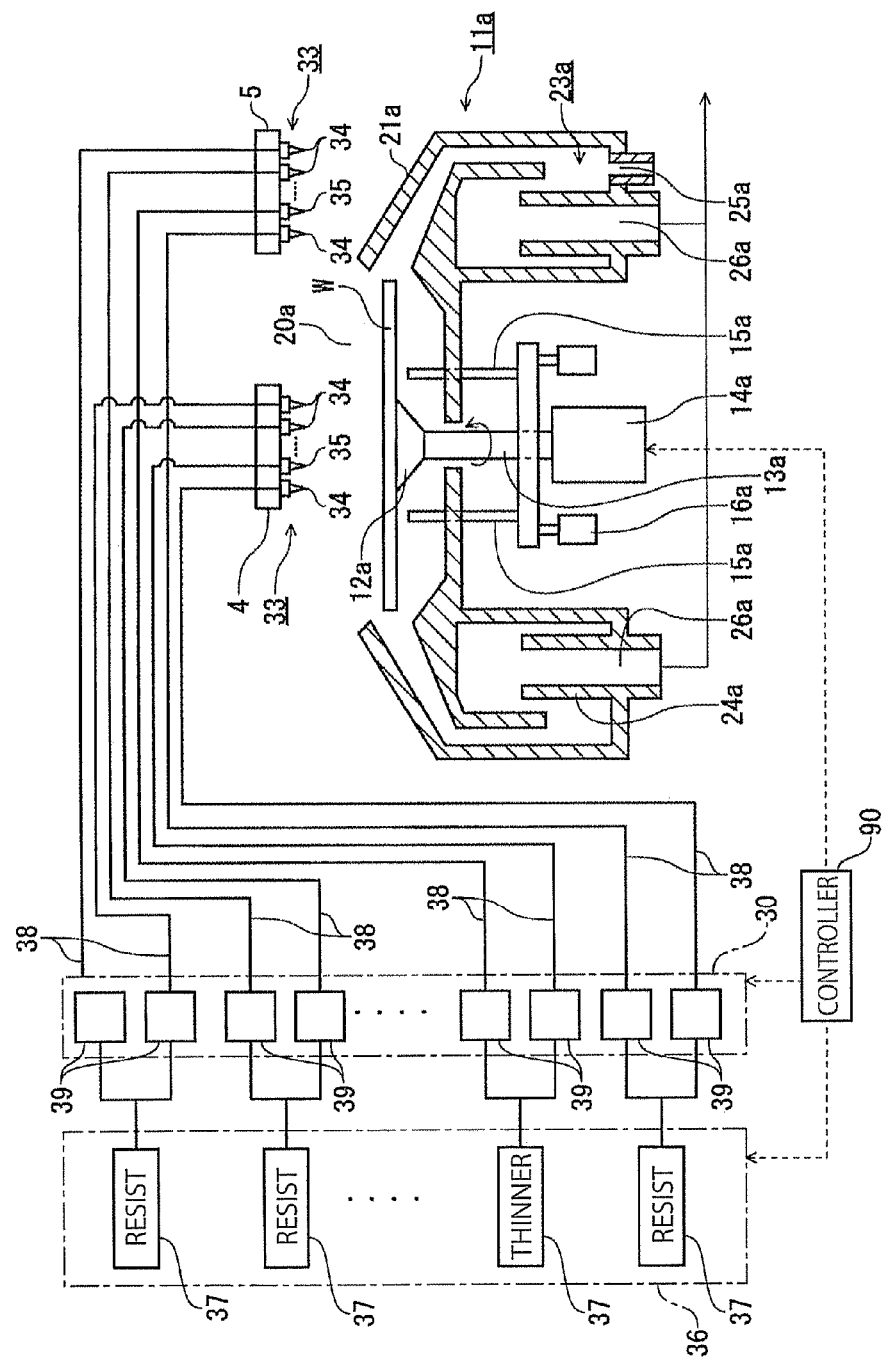
FIG. 3 is a longitudinal sectional view of the resist solution application apparatus shown in FIG. 1.

Indicated at 36 in FIG. 3 is a processing liquid supply unit. The processing liquid supply unit 36 has processing liquid supply mechanisms 37 each including a resist solution tank containing a resist solution to be supplied to the resist solution pouring nozzles 34 and a pressurization device for pressurizing the resist solution tank, and a processing liquid supply mechanism 37 including a thinner tank containing the thinner to be supplied to the thinner spouting nozzles 35 and a pressurization device for pressurizing the thinner tank to supply the thinner to the thinner spouting nozzles 35. The number of the processing liquid supply mechanisms 37 is ten which is equal to the number of the resist solution pouring nozzles 34 and the thinner spouting nozzle 35 of each of the nozzle unit 4 and 5. The resist solution tanks of the processing liquid supply mechanisms 37 contain resist solutions respectively having different resist concentrations. Thus, a resist solution of a desired resist concentration can be poured onto a wafer W.

Indicated at 38 in FIG. 3 are processing liquid supply lines connecting the nozzles 34 and 35 to the processing liquid supply mechanisms 37. A flow controller 30 including valves 39 is placed in the processing liquid supply lines 38. The controller 90 provides control signals for opening and closing the valves 39 to pour the nine kinds of resist solutions and the thinner selectively onto wafers W held by the respective spin chucks 12a to 12d of the resist solution application units 11a to 11d.

Figure 2:
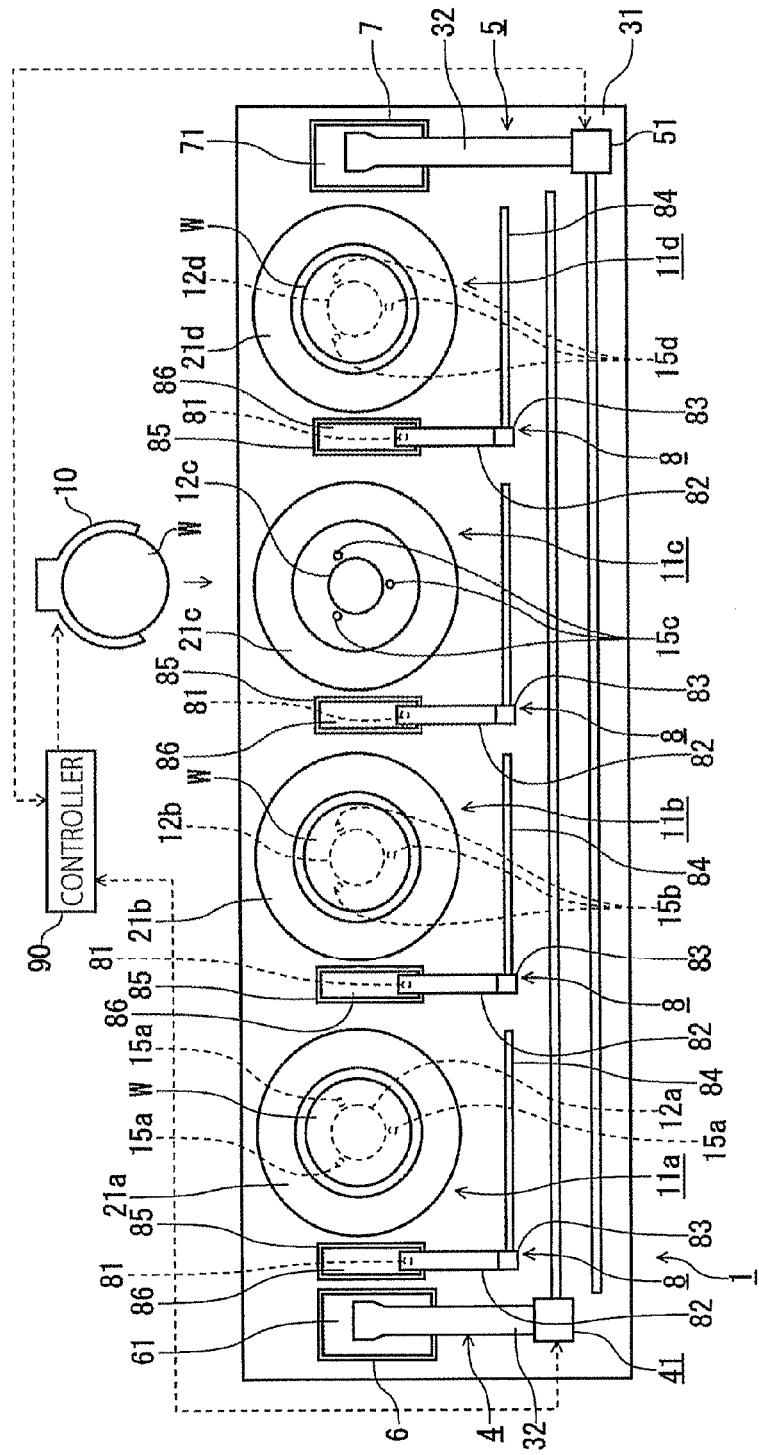
FIG. 2 is a plan view of the resist solution application apparatus shown in FIG. 1.

Referring to FIGS. 1 and 2, nozzle baths 6 and 7 are disposed near the opposite ends of the row of the resist solution application units 11a to 11d. The nozzle bath 6 is a cup having an open upper end. A space in the nozzle bath 6 is used as a waiting space 61 for holding the composite nozzle head 33 of the nozzle unit 4 therein. The nozzle bath 7 is the same in construction as the nozzle bath 6 and defines a waiting space 71 corresponding to the waiting space 61. The waiting space 71 holds the composite nozzle head 33 of the nozzle unit 5 therein. The composite nozzle heads 33 of the nozzle units 4 and 5 are held in the waiting spaces 61 and 71, respectively, when the resist solutions and the thinner do not need to be poured onto wafers W. The nozzle bath 6 will be described by way of example with reference to FIG. 4.

Figure 4:
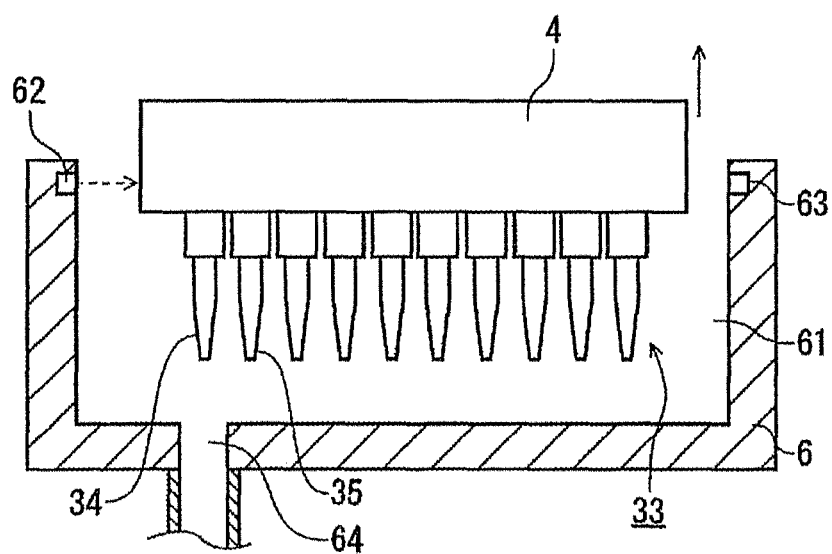
FIG. 4 is a front elevation of a nozzle unit included in the resist solution application apparatus.

The nozzle bath 6 is provided with an optical sensor including a light projector 62 and a light receiver 63. The light receiver 63 sends out a signal corresponding to the amount of light received from the light projector 62 to the controller 90. When the composite nozzle head 33 is held in the waiting space 61 as shown in FIG. 4, light projected by the light projector 62 is intercepted by the composite nozzle head 33 and the output signal of the light receiver 63 changes. The controller 90 decides whether or not the composite nozzle head 33 is held in the waiting space 61 on the basis of the level of the output signal of the light receiver 63. The nozzle bath 6 is provided with a drain port 64. In some cases, the processing liquids are spouted through the nozzles 34 and 35 for maintenance while the composite nozzle head 33 is held in the waiting space 61. When the processing liquids are thus spouted, deposits in the nozzles 34 and 35 and the processing liquid supply lines 38 are removed to clean the processing liquid supply lines. The processing liquids used for cleaning are drained through the drain port 64.

Referring again to FIGS. 1 and 2, the resist solution application apparatus 1 is provided with four edge removing mechanisms 8 for removing an edge part of a resist film formed on a wafer W by each of the resist solution application units 11*a* to 11*d* to prevent the resist film from coming off the wafer W. Each of the edge removing mechanisms 8 is provided with a solvent spouting nozzle 81 for spouting a solvent capable of dissolving the resist film onto a wafer W. The nozzle 81 is supported by a support arm 82. A driving mechanism 83 moves the support arm 82 supporting the solvent spouting nozzle 81 vertically. The driving mechanisms 83 move along guides 84 in directions parallel to the lateral row of the resist solution application units 11*a* to 11*d*. Nozzle baths 85 each having an open upper end are disposed beside the splash cups 21*a* to 21*d*, respectively. The driving mechanism 83 moves the solvent spouting nozzle 81 between a waiting space 86 defined by the nozzle bath 85 and a spouting position above the edge of a wafer W held inside the splash cup 21.

A resist solution application process for applying the resist solution to a wafer W to be executed by the resist solution application apparatus 1 will be described. The resist solution application units 11*a* to 11*d* process wafers W by the same resist solution application process. The resist solution application units 11*a* to 11*d* carries out the resist solution application process in a parallel execution mode. Normally, wafers W are delivered to the resist solution application units 11*a* to 11*d*. The nozzle units 4 and 5 are used for processing wafers W by the resist solution application units 11*a* and 11*b* and for processing wafers W by the resist solution application units 11*c* and 11*d*, respectively. A processing procedure for processing a wafer W delivered to the resist solution application unit 11*a* using the nozzle unit 4 by the resist solution application process will be described by way of example.

The substrate carrying mechanism 10 carries a wafer W to a position above the splash cup 21*a*. Then, the lifting pins 15*a* transfers the wafer W to the spin chuck 12*a* such that the wafer W is held by its central part by the spin chuck 12*a*. Subsequently, the wafer W is rotated at a predetermined rotating speed about a vertical axis, and the composite nozzle head 33 is moved from the nozzle bath 6 to a position above the wafer W such that the thinner spouting nozzle 35 is located at a position directly above the center of the wafer W and at a predetermined height from the wafer W. Then, the thinner is spouted through the thinner spouting nozzle 35 onto a central part of the wafer W.

After stopping spouting the thinner, the resist solution pouring nozzle 34 is located above a central part of the wafer W, and then the resist solution is poured onto the central part of the wafer W. The resist solution is spread radially outward by centrifugal force to spread the thinner wetting the surface of the wafer W toward the edge of the wafer W. Thus, the resist solution is spread all over the surface of the wafer W by a spin-coating effect. The composite nozzle head 33 of the nozzle unit 4 is returned to the waiting space 61 in the nozzle bath 6 after stopping pouring the resist solution. Subsequently, the solvent spouting nozzle 81 is moved from the nozzle bath 85 to a position above the edge of the wafer W and the thinner is spouted through the solvent spouting nozzle 81 to remove part of a resist film from a circumferential part of the surface of the wafer W. Then, the solvent pouring nozzle 81 is returned to the nozzle bath 85, the lifting pins 15*a* transfer the wafer W to the substrate carrying mechanism 10, and then the wafer W is carried out from the resist solution application apparatus 1.

Figure 5:
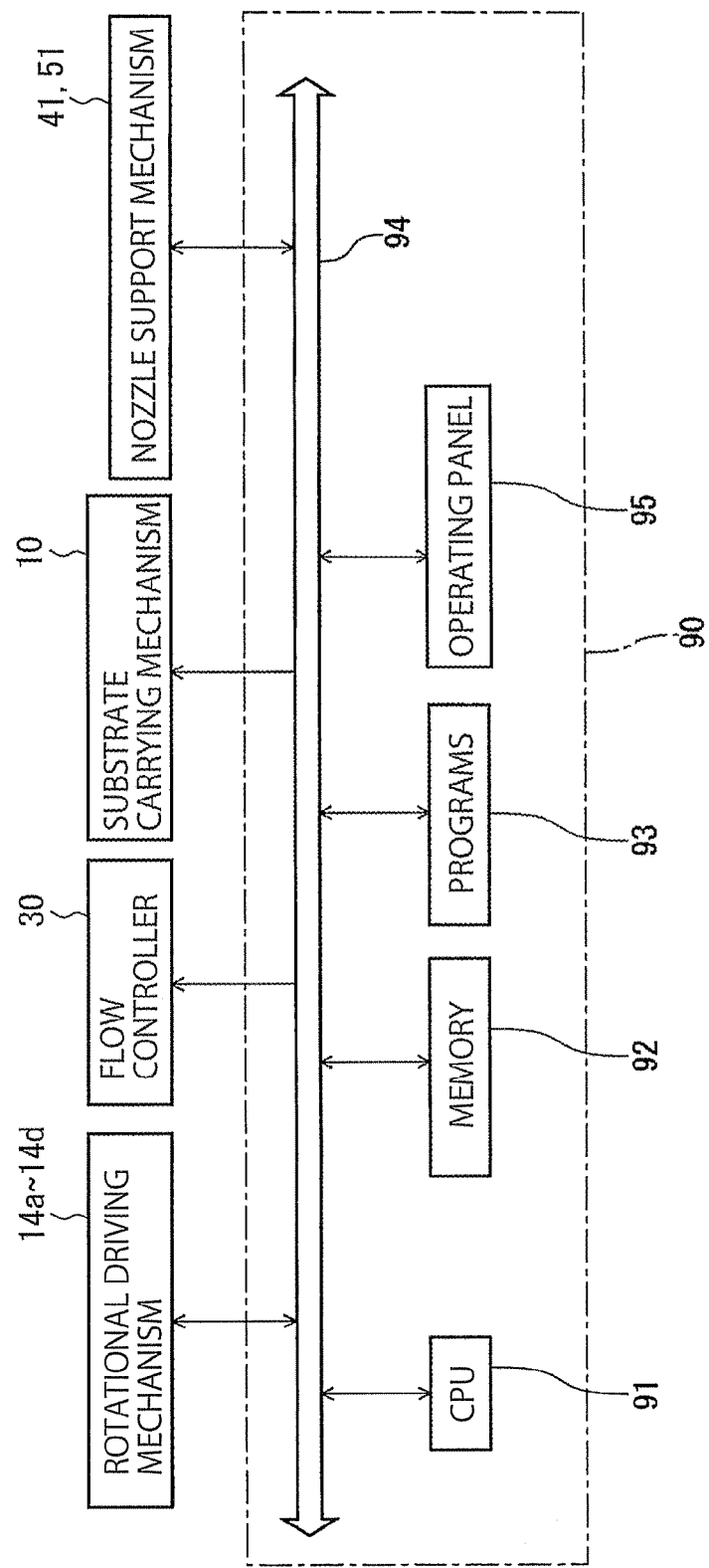
FIG. 5 is a block diagram of a controller included in the resist solution application apparatus shown in FIG. 1.

The controller 90 included in the resist solution application apparatus 1 will be described with reference to FIG. 5. The controller 90 has a CPU 91, a memory 92 and programs 93. Components of the controller 90 are connected to a bus 94. The programs 93 are sets of instructions commanding the controller 90 to send control signals to the components of the resist solution application apparatus 1 to carry out the resist solution application process. The controller 90 controls wafer rotating operations of the rotational driving mechanisms 14*a* to 14*d* for rotating a wafer W, wafer transfer operations of the lifting pins 15*a* to 15*d* for transferring a wafer W, carrying operations of the substrate carrying mechanism 10 for carrying a wafer W, operations of the nozzle support mechanisms 41 and 51 for moving the nozzle units 4 and 5, and operations of the flow controller 30 for controlling operations for pouring the resist solution and the thinner onto a wafer W. The programs 93 including instructions commanding operations for entering process parameters and displaying information are stored in a storage medium, such as a flexible disk, a compact disk, a hard disk, a magnetooptical disk or a memory card, and the storage medium is installed in the controller 90.

The controller 90 has an operating panel 95, such as a touch panel. The operator of the resist solution application apparatus 1 decides a component part of the resist solution application apparatus 1 to be unused for maintenance or a component part of the resist solution application apparatus 1 malfunctioning due to trouble or an accident by operating the operating panel 95. Then, the resist solution application units 11 to which wafers W are delivered automatically and the nozzle unit to be used in the normal operating state are changed according to the foregoing decision. The operator can manually change the resist solution application units 11 to which wafers W are to be delivered and the nozzle unit to be used by operating the operating panel 95.

Figure 6:
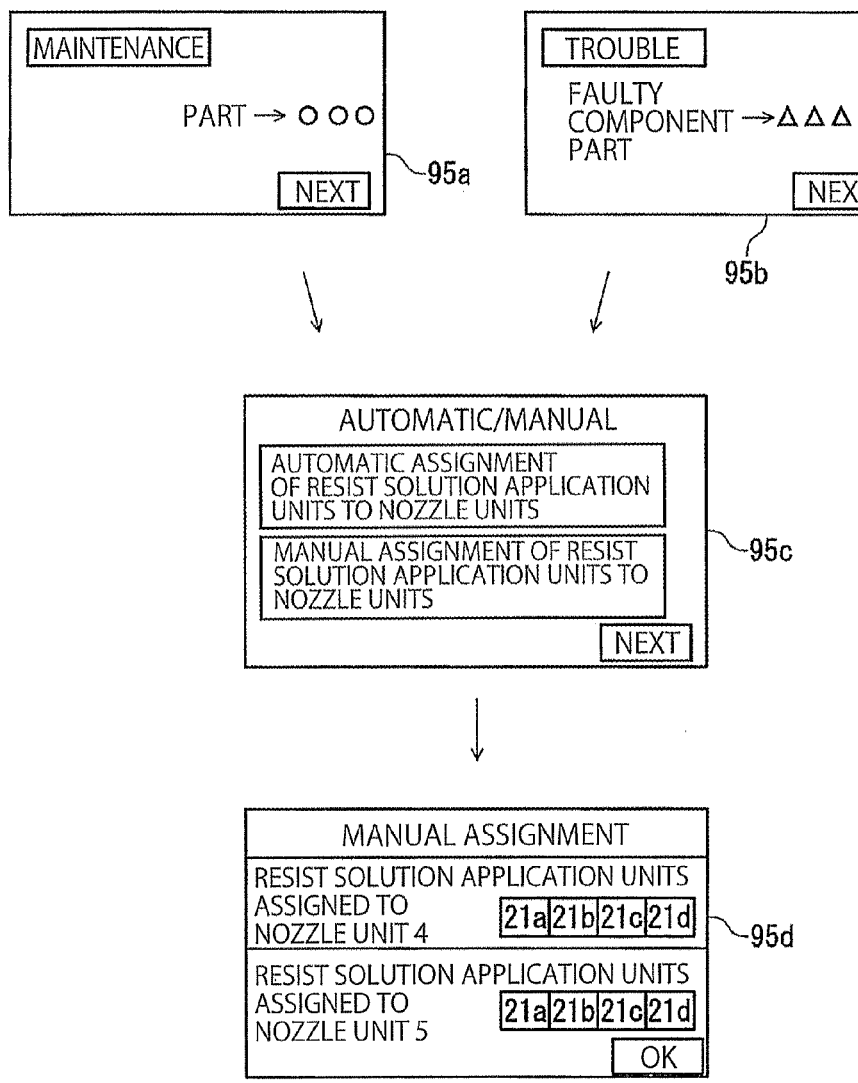
FIG. 6 is a flow diagram of assistance in explaining a setting operation using an operating panel by way of example.

FIG. 6 shows information displayed on the operating panel 95 by way of example. The operator can enter a component part that needs maintenance among the nozzle units 4 and 5 and the resist solution application units 11*a* to 11*d* by operating a first picture 95*a* displayed on the operating panel 95. When the nozzle units 4 and 5 are entered as component parts that need maintenance, an operation for cleaning the processing liquid supply lines by spouting the processing liquid in the waiting spaces 61 and 71 or maintenance work for changing other component parts is entered in the first picture 95*a*.

Figure 7:
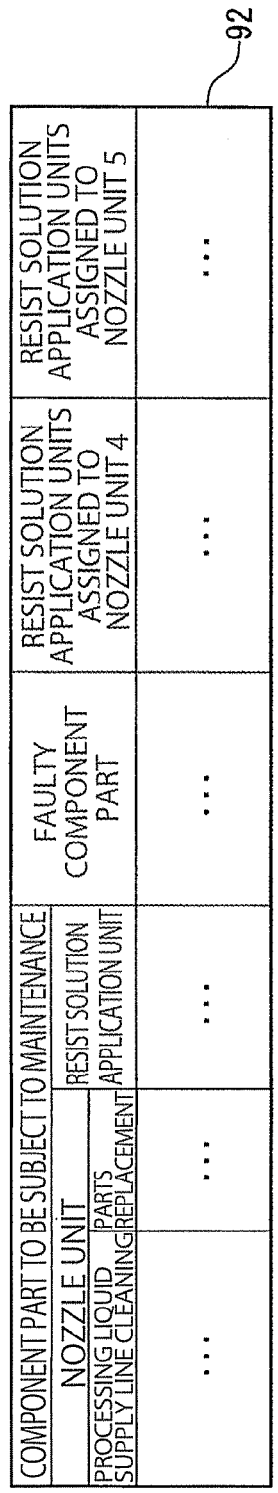
FIG. 7 is a view of assistance in explaining a memory included in the controller.

The operator can change the first picture 95*a* for a second picture 95*b*. The operator can enter a component part among the nozzle units 4 and 5 and the resist solution application units 11*a* to 11*d* as a faulty component part by operating the second picture 95*b*. FIG. 7 shows the memory 92. The component part that needs maintenance entered by operating the first picture 95*a* and the faulty component part entered by operating the second picture 95*b* are stored in the memory 92.

The operator can change the second picture 95b for a third picture 95c. When the component part that needs maintenance is entered by operating the first picture 95a, the second picture 95b is not displayed and the third picture 95c is displayed. The operator can choose either an automatic or a manual selection mode for choosing the resist solution application units 11 for which the nozzle units 4 and 5 operate by operating the third picture 95c. When the automatic selection mode is chosen, the program 93 decides the resist solution application units 11 to which wafers W are to be automatically delivered and the nozzle unit to be used, on the basis of the component part that needs maintenance and the faulty component part stored in the memory 92. When the manual selection mode is chosen by operating the third picture 95c, a fourth picture 95d is displayed on the operating panel 95. The operator can enter the resist solution application units 11 for which the nozzle units 4 and 5 are to be used in the fourth picture 95d.

In the following description, wafers W are designated by the letters of the Latin alphabet A. B, C and such indicating lots and numerals indicating numerical order in which wafers W of each lot are carried into the resist solution application apparatus 1 and suffixed onto the letters indicating lots. For example, a wafer W of a lot A to be carried third into the resist solution application apparatus 1 is designated by A3, and a wafer W of a lot next to the lot A to be carried fifth into the resist solution application apparatus 1 is designated by B5.

Figure 8:
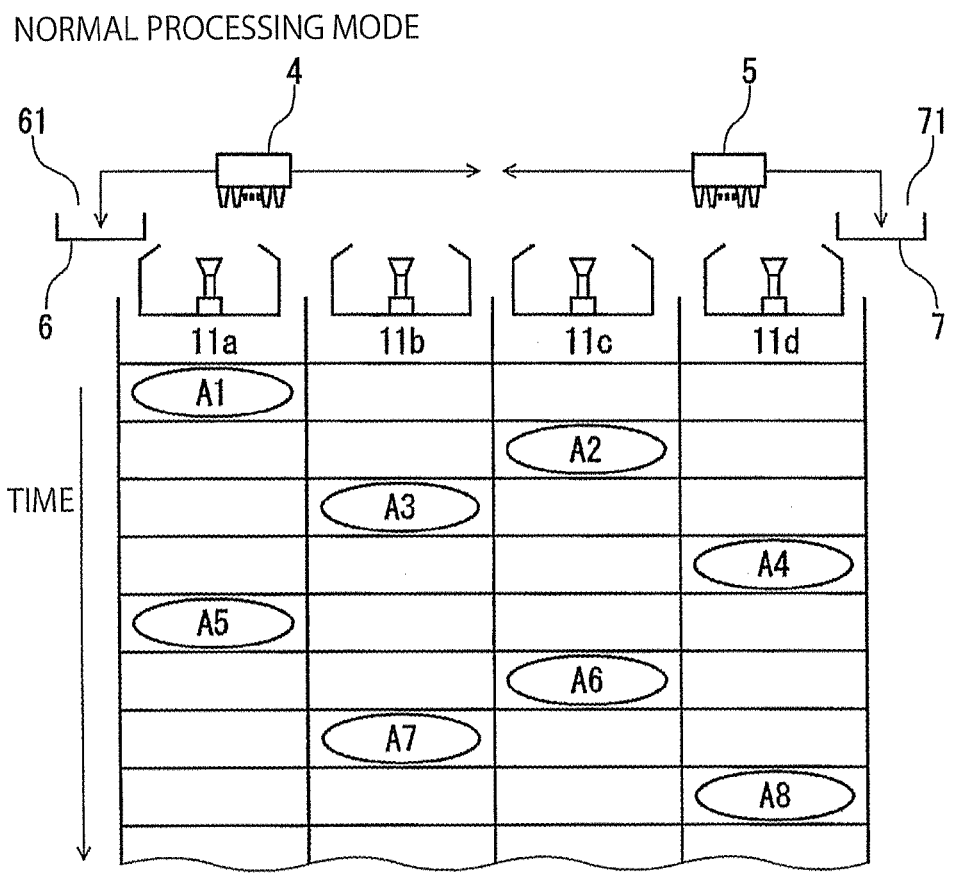
FIG. 8 is a flow diagram illustrating wafer carrying operations of the resist solution application apparatus shown in FIG. 1 and operations of the nozzle units.

FIG. 8 shows, in a time series, operations of the substrate carrying mechanism 10 for carrying wafers A1 to A8 to the resist solution application units 11a to 11d. The arrows in an upper part of FIG. 8 define ranges in which the nozzle units 4 and 5 move, respectively. A first group G1 includes the resist solution application units 11a and 11b, and a second group G2 includes the resist solution application units 11c and 11d. Wafers A1 to A8 are delivered alternately to the first group G1 and the second group G2. Wafers A1 to A8 are delivered alternately to the resist solution application units of each of the first group G1 and the second group G2. More concretely, wafers A1, A2, A3 and A4 are delivered sequentially to the resist solution application units 11a, 11c, 11b and 11d, respectively. The nozzle unit 4 is used for processing the wafers A1, A3, A5 and A7 delivered to the resist solution application units 11a and 11b, and the nozzle unit 5 is used for processing the wafers A2, A4, A6 and A8 delivered to the resist solution application units 11c and 11d.

Manners of carrying wafers W and using the nozzle units 4 and 5 in cases some component part of the resist solution application apparatus 1 needs maintenance or malfunctions. In the following cases, it is supposed that the operator operates the operating panel 95 to choose the automatic selection mode for selecting the resist solution application units 11 for which the nozzle units 4 and 5 are to be used.

Case 1: The Nozzle Unit 4 Needs Maintenance and the Processing Liquid Supply Lines Need Cleaning.

Figure 9:
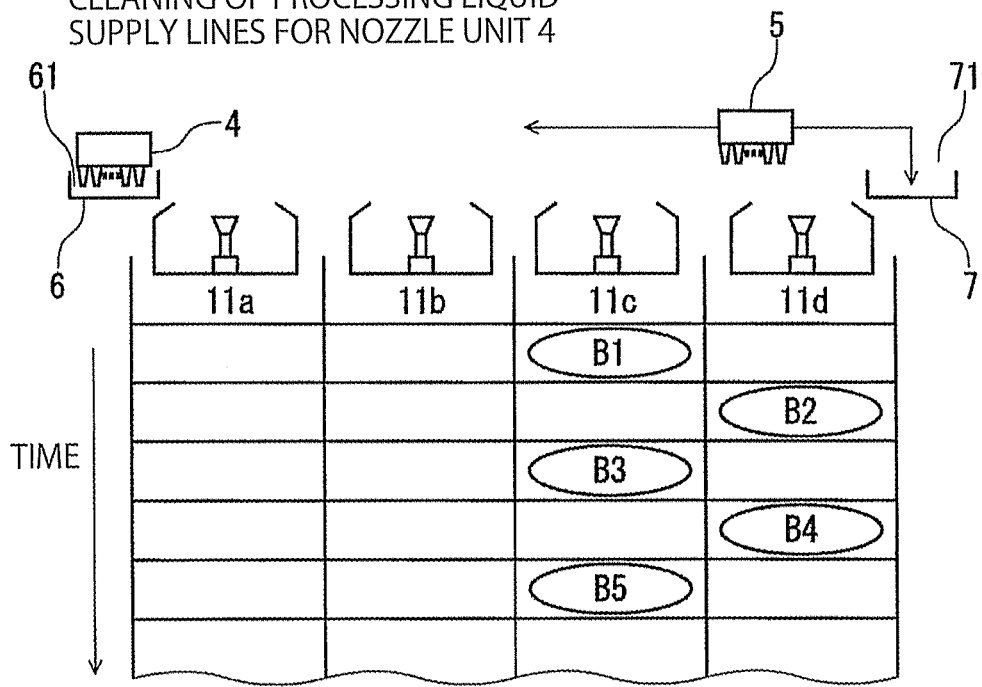
FIG. 9 is a flow diagram illustrating operations of wafer carrying operations of the resist solution application apparatus shown in FIG. 1 and operations of the nozzle units.

When the foregoing condition for Case 1 is determined, wafers W of the lot A in process in the resist solution application apparatus 1 are processed in the normal processing mode. After all the wafers Ai (i=1, 2 . . . , n) of the lot A have been processed, the nozzle unit 4 discharges the processing liquids in the waiting space 61 of the nozzle bath 6 to clean the processing liquid supply lines. Meanwhile, wafers Bi (i=1, 2, . . . , n) of the lot B are carried alternately to the resist solution application units 11c and 11d, and the nozzle unit 5 is used for processing the wafers Bi of the lot B as shown in FIG. 9. After maintenance work has been completed, the normal wafer processing operation is resumed to process wafers W of the next lot by using the nozzle units 4 and 5 and the resist solution application units 11a to 11d.

Case 2: The Nozzle Unit 4 Needs Maintenance and the Processing Liquid Supply Lines do not Need Cleaning.

Figure 10:
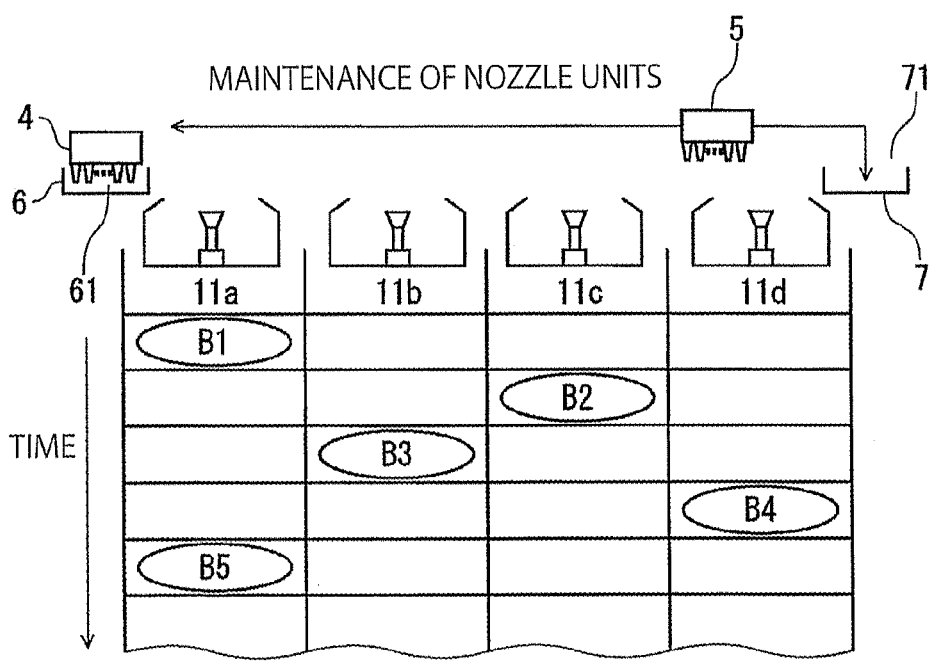
FIG. 10 is a flow diagram illustrating wafer carrying operations of the resist solution application apparatus shown in FIG. 1 and operations of the nozzle units.

When the foregoing condition for Case 2 is determined, wafers W of the lot A in process in the resist solution application apparatus 1 are processed in the normal processing mode. After all the wafers Ai of the lot A have been processed, the composite nozzle head 33 of the nozzle unit 4 is held in the waiting space 61 of the nozzle bath 6. Wafers Bi of the lot B are carried sequentially to the resist solution application units 11a to 11d in normal order as shown in FIG. 10, and only the nozzle unit 5 is used for processing the wafers Bi of the lot B. While the wafers Bi of the lot B are in process, the operator carries out maintenance work for changing parts of the nozzle unit 4 and such. After the maintenance has been completed, the operator operates the operating panel 95 to determine predetermined conditions, and then the normal wafer processing operation is resumed to process wafers W of the next lot.

The resist solution application units 11a and 11b are not used in Case 1 to prevent the mist of the processing liquids discharged into the nozzle bath 6 from adhering to wafers W being processed by the resist solution application units 11a and 11b adjacent to the nozzle bath 6. In Case 2, all the resist solution application units 11a to 11d are used to enhance throughput by processing wafers W by the parallel processing operations of the resist solution application units.

If a decision that the nozzle unit 5 needs maintenance is made instead of the decision that the nozzle unit 4 needs maintenance in Case 1, the nozzle units 4 and the resist solution application units 11a and 11b are used for processing wafers W. If a decision that the nozzle unit 5 needs maintenance is made instead of the decision that the nozzle unit 4 needs maintenance in Case 2, the nozzle units 4 and the resist solution application units 11a to 11d are used for processing wafers W.

Case 3: The Nozzle Unit 4 is Malfunctioning.

Figure 11:
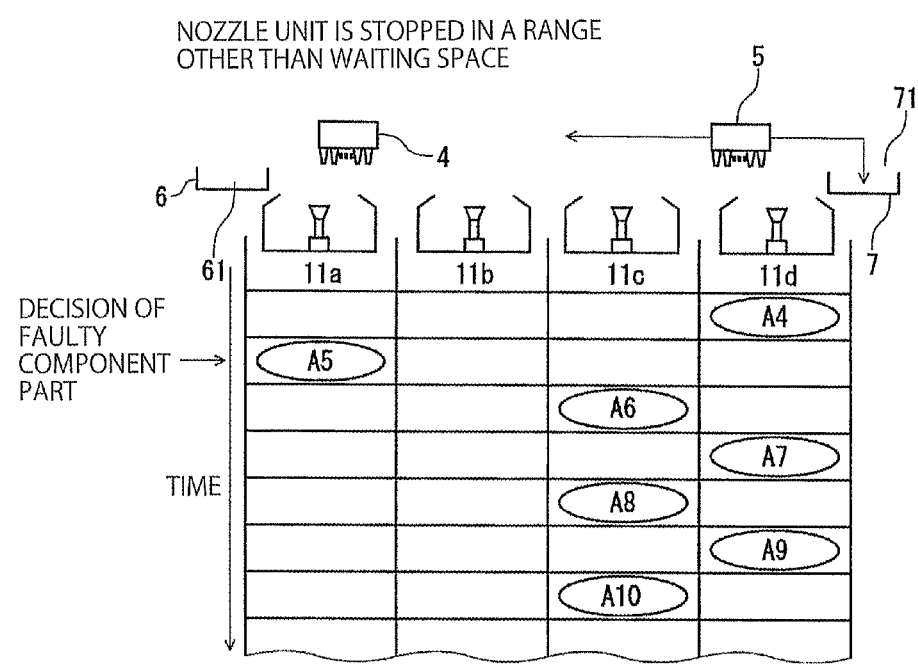
FIG. 11 is a flow diagram illustrating wafer carrying operations of the resist solution application apparatus shown in FIG. 1 and operations of the nozzle units.

When the foregoing condition for Case 3 is decided, the controller 90 stops the nozzle unit 4 and decides whether or not the composite nozzle head 33 of the nozzle unit 4 is held in the waiting space 61. If the composite nozzle head 33 of the nozzle unit 4 is in a range outside the waiting space 61, wafers W are carried alternately to the resist solution application units 11c and 11d and only the nozzle unit 5 is used for processing the wafers Ai of the lot A. In FIG. 11, a malfunctioning component part is decided after a wafer A5 has been delivered to the resist solution application unit 11a, a wafer A6 and the flowing wafers are delivered to the resist solution application units 11c and 11d, and the nozzle unit 5 is used for processing those wafers.

Figure 12:
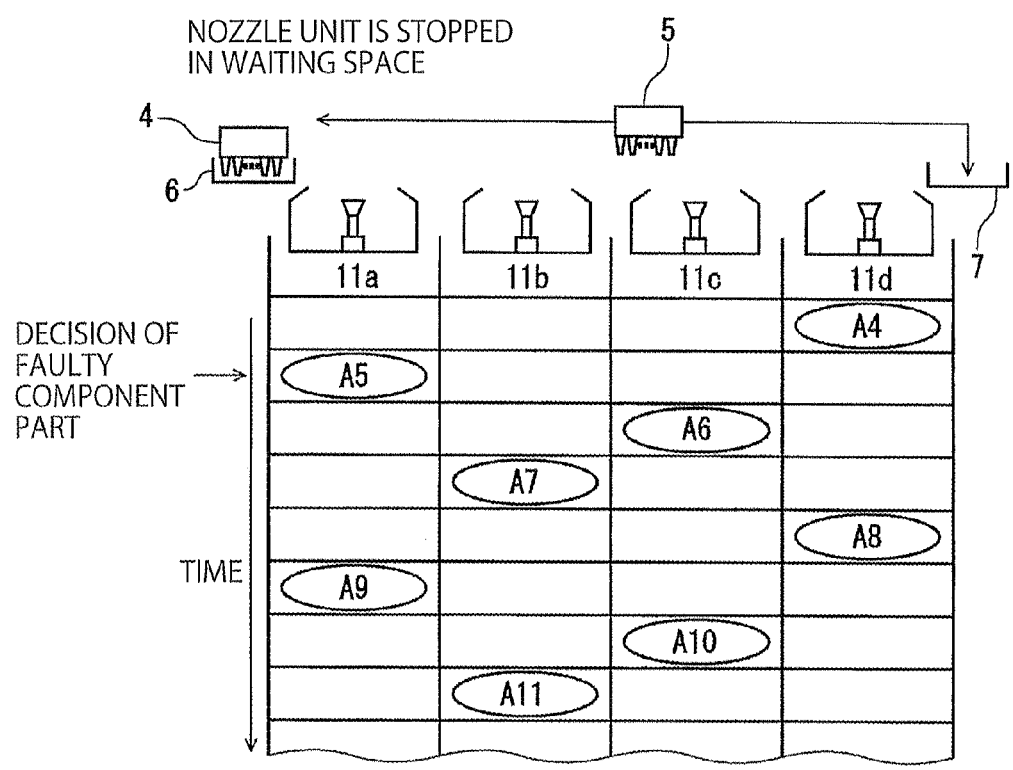
FIG. 12 is a flow diagram illustrating wafer carrying operations of the resist solution application apparatus shown in FIG. 1 and operations of the nozzle units.

When the controller 90 decides that the composite nozzle head 33 of the nozzle unit 4 is held in the waiting space 61, the respective destinations of wafers W are not changed and the wafers W are delivered to the resist solution application units 11a to 11d in normal order. After this decision has been made, the wafers W delivered to the resist solution application units 11a to 11d are processed by using the nozzle unit 5. FIG. 12 shows, by way of example, a state where a malfunctioning component part is decided and the foregoing decision is made after the wafer A5 has been delivered to the resist solution application unit 11a, and the wafer A6 and the following wafers are processed by using the nozzle unit 5. In case 3, the normal wafer processing operation for processing wafers W of the next lot is resumed after the operator has entered predetermined conditions by operating the operating panel 95.

Wafers W are processed by the resist solution application units 11c and 11d when the nozzle unit 4 is stopped with the composite nozzle head 33 positioned in a range outside the waiting space 61 to avoid collision between the nozzle units 4 and 5. Since the nozzle units 4 and 5 do not collide with each other when the nozzle unit 4 is stopped with the composite nozzle head 33 positioned in the waiting space 61, it is expedient to use all the resist solution application units 11a to 11d for suppressing the reduction of throughput.

When a decision that the nozzle unit 5 is malfunctioning is made instead of the decision that the nozzle unit 4 is malfunctioning in Case 3, the destinations of wafers W are dependent on a position where the nozzle unit 5 is stopped. If the nozzle unit 5 is stopped with its composite nozzle head 33 in a range outside the waiting space 71, wafers W are delivered alternately to the resist solution application units 11a and 11b, and the nozzle unit 4 is used for processing the wafers W. If the nozzle unit 5 is stopped with its composite nozzle head 33 held in the waiting space 71, wafers W are delivered to all the resist solution application units 11a to 11d in a normal delivery mode and the nozzle unit 4 is used for processing the wafers W delivered to the resist solution application units 11a to 11d.

Case 4: A Decision that the Resist Solution Application Unit 11a is Faulty is Made.

Figure 13:
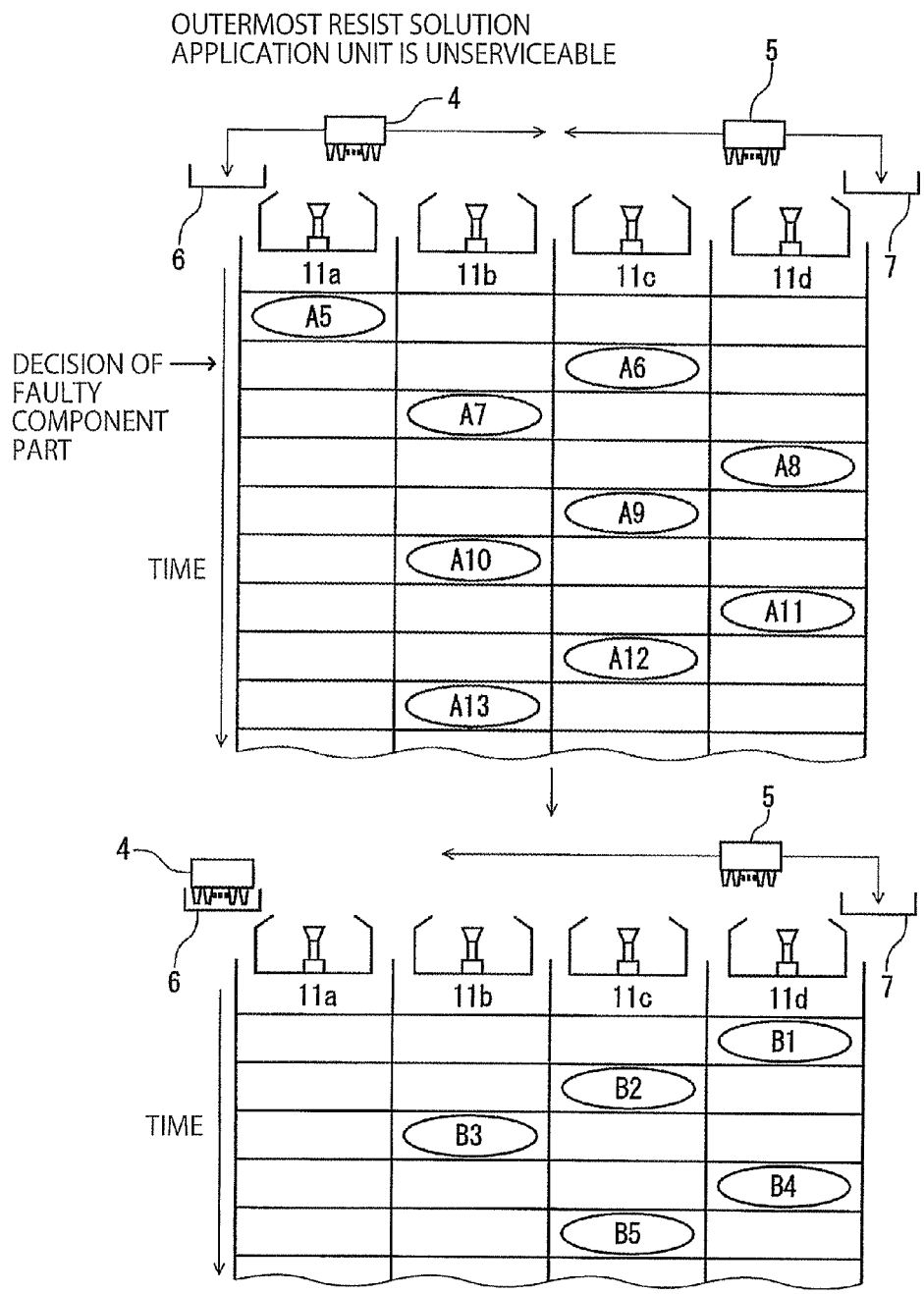
FIG. 13 is a flow diagram illustrating wafer carrying operations of the resist solution application apparatus shown in FIG. 1 and operations of the nozzle units.

When a decision that the resist solution application unit 11a is faulty is made, the substrate carrying mechanism 10 delivers wafers W of the lot A to be carried into the resist solution application apparatus 1 sequentially to the resist solution application units 11b to 11d in order of completion of processing wafers W. Thereafter, wafers W of the lot A are delivered repeatedly in that order to the resist solution application units 11b to 11d. The nozzle unit 4 is used for processing wafers W by the resist solution application unit 11b, and the nozzle unit 5 is used for processing wafers W by the resist solution application units 11c and 11d. An upper drawing in FIG. 13 illustrates a mode of sequential delivery of wafers A6 to A13 to the resist solution application units 11b to 11d when the foregoing decision is made after a wafer A6 has been delivered to the resist solution application unit 11c.

After operations for processing all the wafers Ai of the lot A have been completed, the composite nozzle head 33 of the nozzle unit 4 is held for waiting in the waiting space 61. As illustrated in a lower drawing shown in FIG. 13, wafers Bi of the next lot B are delivered to the resist solution application units 11b to 11d in the same sequence as that in which the wafers Ai of the lot A were delivered to the resist solution application units 11b to 11d. The nozzle unit 5 is used for processing the wafers Bi of the lot B delivered to the resist solution application units 11b to 11d. The operator repairs the resist solution application unit 11a while the wafers Bi of the lot B are being processed. In Case 4, the normal wafer processing operation for processing the wafers W of the next lot is resumed after the operator has entered predetermined conditions by operating the operating panel 95.

As mentioned above, neither the composite nozzle head 33 of the nozzle unit 4 does not move over the resist solution application unit 11b while the wafers Bi of the lot B are being processed and the composite nozzle head 33 of the nozzle unit 4 is held in the waiting space 61. Therefore, the operator can access and repair the resist solution application unit 11a without being interfered with by the nozzle units 4. Since the nozzle unit 5 is used for processing the wafers Bi of the lot B while the resist solution application unit 11a is under repair, the reduction of throughput due to the interruption of using the nozzle unit 4 can be suppressed.

In Case 4, the same operations as those executed when the resist solution application unit 11a is under repair are executed when the resist solution application unit 11d at the opposite end of the row of the resist solution application units 11a to 11d is faulty. More concretely, wafers W are delivered to the resist solution application units 11a to 11c, and the composite nozzle head 33 of the nozzle unit 5 is held in the waiting space 71. An example of trouble in one of the resist solution application units 11a to 11d is an unserviceable state of one of the spin chucks 12a to 12d due to the malfunction of one of the rotational driving mechanisms 14a to 14d.

Case 5: A Decision that the Resist Solution Application Unit 11b is Faulty is Made.

Figure 14:
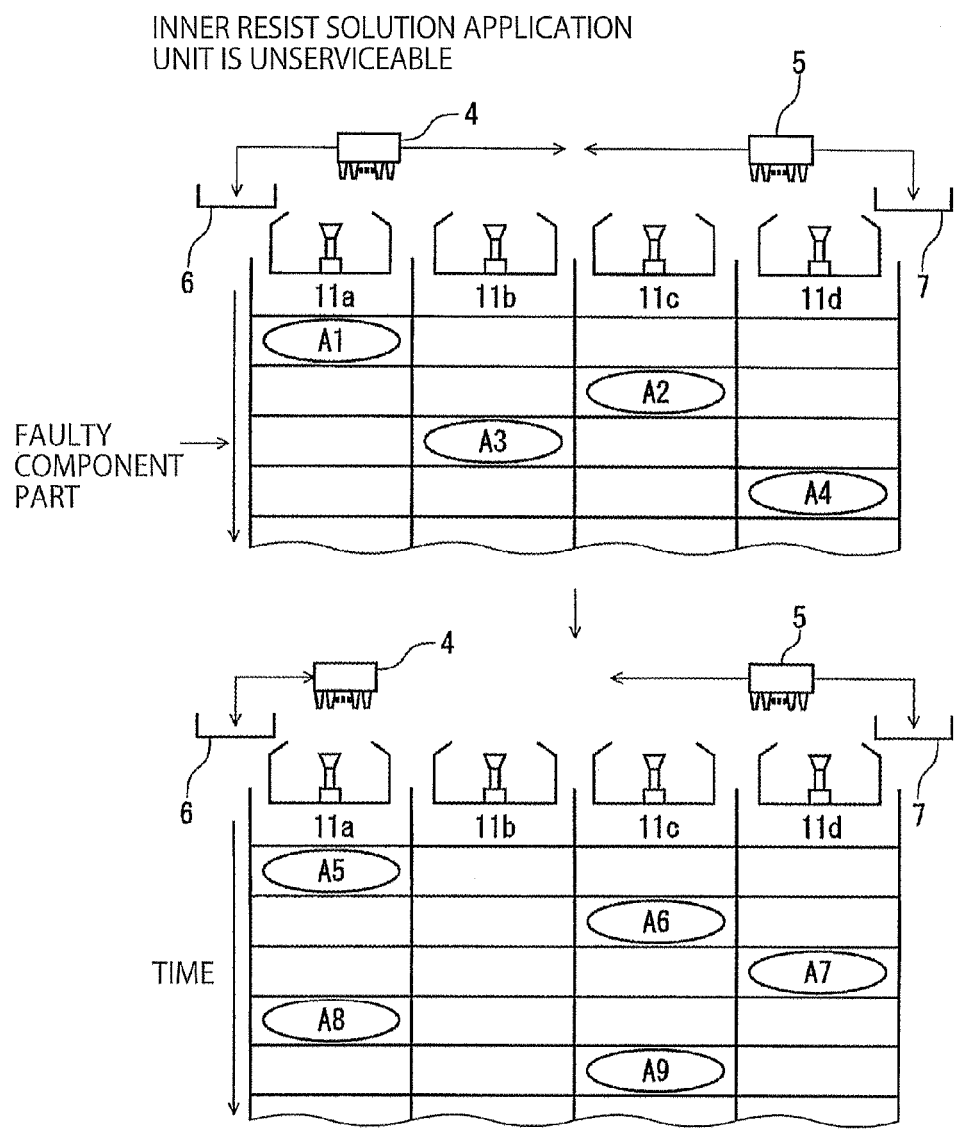
FIG. 14 is a flow diagram illustrating wafer carrying operations of the resist solution application apparatus shown in FIG. 1 and operations of the nozzle units.

When a decision that the resist solution application unit 11b is faulty is made, the substrate carrying mechanism 10 delivers wafers W of the lot A succeeding the wafers W in process sequentially to the resist solution application units 11a, 11c and 11d in order of completion of processing wafers W. Thereafter, wafers W are delivered repeatedly in that order to the resist solution application units 11a, 11c and 11d. The nozzle unit 4 is used for process the wafers W by the resist solution application unit 11a, and the nozzle unit 5 is used for processing wafers W by the resist solution application units 11c and 11d. FIG. 14 illustrates a mode of sequential delivery of wafers W of the lot A to the resist solution application units 11a, 11c and 11d when the foregoing decision is made after a wafer A3 has been delivered to the resist solution application unit 11b.

The composite nozzle heads 33 of the nozzle units 4 and 5 do not move over the resist solution application unit 11b after the foregoing decision has been made. Therefore, the operator can access and repair the resist solution application unit 11b without being interfered with by the nozzle units 4 and 5. After the repair of the resist solution application unit 11b has been completed, the operator operates the operating panel 95 to determine predetermined conditions, and then the normal wafer processing operation is resumed to process wafers W of the next lot.

If a decision that the resist solution application unit 11c needs repair is made instead of the decision that the resist solution application unit 11b needs repair in Case 5, operations similar to the foregoing operations are executed. More concretely, wafers W are carried to the resist solution application units 11a, 11b and 11d. The nozzle unit 4 is used for processing wafers W by the resist solution application units 11a and 11b, and the nozzle unit 5 is used for processing wafers W by the resist solution application unit 11d.

Operations similar to, for example, those executed in Cases 4 and 5 are executed when a decision that the resist solution application units 11a and 11b need maintenance is made in Cases 4 and 5 instead of the decision that the resist solution application units 11a and 11b are faulty.

If any one of the resist solution application units 11a to 11d of the resist solution application apparatus 1 becomes unserviceable as mentioned above, the nozzle unit that is not used for processing a wafer W by the unserviceable resist solution application unit 11 in the normal processing mode is used for processing wafers W by the resist solution application unit 11. Thus, the reduction of throughput can be suppressed even if some component part of the resist solution application apparatus 1 needs maintenance or is faulty. Since the two nozzle units 4 and 5 are used for processing wafers W by the resist solution application units 11a to 11d in the normal processing mode, throughput is high as compared with that when a single nozzle unit is used. Even if a resist solution pouring time is extended, reduction of throughput due to the extension of resist solution pouring time can be suppressed.

Although the operator decides a faulty component part in the foregoing examples, a faulty component part may be automatically detected by the controller 90 instead of the decision of a faulty component part by the operator. For example, the controller 90 compares the output rotating speeds of the rotational driving mechanisms 14a to 14d calculated on the basis of output signals provided by the rotational driving mechanisms 14a to 14d with a predetermined rotating speed, the resist solution application unit 11 including the rotational driving mechanism 14 is decided to be a faulty component part when the difference between the predetermined rotating speed and the output rotating speed of the rotational driving mechanism 14 included in the resist solution application unit 11 is not lower than a predetermined set value, and processing operations for Case 4 or 5 are executed automatically.

In another case, the controller 90 determines the respective positions of the nozzle support mechanisms 41 and 51 on the base 31 with respect to the lateral direction on the basis of output signals provided by the nozzle support mechanisms 41 and 51. The controller 90 calculates the difference between the duration of transmission of a control signal provided by the controller 90 for moving the nozzle support mechanism 41 to a predetermined position with respect to the lateral direction and the duration of transmission of an output signal provided by the nozzle support mechanism 41 upon the arrival of the nozzle support mechanism 41 at the predetermined position, and the difference between the duration of transmission of a control signal provided by the controller 90 for moving the nozzle support mechanism 51 to a predetermined position with respect to the lateral direction and the duration of transmission of an output signal provided by the nozzle support mechanism 51 upon the arrival of the nozzle support mechanism 51 at the predetermined position. When the difference is greater than a set value, it is decided that the nozzle unit including the nozzle support mechanism that caused the large difference is a faulty component part, and then the processing operations for Case 3 are executed automatically.

The wafer carrying operations mentioned in the description of those cases are only examples, and wafer carrying operations of the present disclosure are not limited to those explained by way of example. For example, wafers W may be carried to the resist solution application units 11b to 11d and the nozzle unit 5 may be used for processing those wafers W in Case 1.

The processing liquid which is poured through the nozzles of the nozzle units of the present disclosure is not limited to the resist solution and may be a developer or a processing liquid for forming antireflection films.

What is claimed:

1. A wet processing method to be carried out by a wet processing apparatus for processing substrates by pouring onto substrates a processing liquid supplied by a processing liquid supply system, including 2n processing units arranged in a lateral row, including 2n substrate holders for supporting a substrate in a horizontal position and 2n splash cups respectively surrounding the substrate holders, wherein the processing units are divided into a first group of n processing units on the left side and a second group of n processing units on the right side and where n is an integer not smaller than 2; a first nozzle unit to be used exclusively for processing substrates by the n processing units of the first group in a normal processing mode; a first nozzle support mechanism supporting the first nozzle unit and capable of moving the first nozzle unit to all the 2n processing units; a second nozzle unit to be used exclusively for processing substrates by the n processing units of the second group in the normal processing mode; a second nozzle support mechanism supporting the second nozzle unit and capable of moving the second nozzle unit to all the 2n processing units; a substrate carrying mechanism for transferring a substrate to and receiving a substrate from the substrate holders; said wet processing method comprising the steps of:

pouring the processing liquid through the first nozzle unit onto substrates supported on the substrate holders of the processing units of the first group in the normal processing mode;

pouring the processing liquid through the second nozzle unit onto substrates supported on the substrate holders of the processing units of the second group in the normal processing mode;

transferring substrates alternately to the processing unit of the first group and that of the second group so as to use the processing units of the first and the second group in order; and either laterally moving the first nozzle unit for the processing units of the first group to use the first nozzle unit for processing substrates by the serviceable ones of the processing units of the second group when the substrate holders of the processing unit of the second group, the processing liquid supply system, or the second nozzle support mechanism is unserviceable or laterally moving the second nozzle unit for the processing units of the second group to use the second nozzle unit for processing substrates by the serviceable ones of the processing units of the first group when the substrate holders of the processing unit of first group, the processing liquid supply system, or the first nozzle support mechanism is unserviceable.

2. The wet processing method according to claim 1 further comprising a step of moving the first nozzle unit to use the first nozzle unit for processing substrates by the processing units of the second group specified by the operator when the processing units of the second group are unable to process substrates or moving the second nozzle unit to use the second nozzle unit for processing substrates by the processing units of the first group specified by the operator when the processing units of the first group are unable to process substrates.

3. The wet processing method according to claim 1 further comprising the step of moving the first nozzle unit to use the first nozzle unit for processing substrates by the processing units of the second group previously specified according to the state when the processing units of the second group are unable to process substrates or moving the second nozzle unit to use the second nozzle unit for processing substrates by the processing units of the first group previously specified according to the state when the processing units of the first group are unable to process substrates.

4. A non-transitory storage medium storing computer programs including sets of instructions to be executed by a wet processing apparatus to carry out the substrate processing method according to claim 1.

* * * * *